(12) United States Patent  
Dyer et al.

(10) Patent No.: US 9,106,249 B1  
(45) Date of Patent: Aug. 11, 2015

(54) CALIBRATION OF A TIME-INTERLEAVED ANALOG-TO-DIGITAL CONVERTER

(71) Applicant: SEMTECH CORPORATION, Camarillo, CA (US)

(72) Inventors: Kenneth Colin Dyer, Pleasanton, CA (US); Jayant Vivrekar, San Jose, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/477,743

(22) Filed: Sep. 4, 2014

(51) Int. Cl.
| | |
|---|---|
| *H03M 1/10* | (2006.01) |
| *H03M 1/12* | (2006.01) |
| *H03M 1/00* | (2006.01) |

(52) U.S. Cl.
CPC ............ *H03M 1/1295* (2013.01); *H03M 1/002* (2013.01)

(58) Field of Classification Search
CPC ... H03M 1/1215; H03M 1/12; H03M 1/0836; H03M 1/10; H03M 1/1009; H03M 1/00; H03M 1/1042; H03M 1/1205
USPC .................. 341/118, 120, 141, 142, 155, 161
See application file for complete search history.

(56) References Cited

U.S. PATENT DOCUMENTS

| | | | | |
|---|---|---|---|---|
| 5,294,926 | A * | 3/1994 | Corcoran ....................... | 341/120 |
| 7,126,511 | B2 * | 10/2006 | Draxelmayr et al. .......... | 341/136 |
| 7,227,479 | B1 * | 6/2007 | Chen et al. .................... | 341/118 |
| 7,336,729 | B2 * | 2/2008 | Agazzi ........................... | 375/316 |
| 7,352,316 | B2 * | 4/2008 | Hori et al. ..................... | 341/155 |
| 7,394,415 | B2 * | 7/2008 | Fuse et al. ..................... | 341/120 |
| 7,839,323 | B2 * | 11/2010 | Kidambi ........................ | 342/118 |
| 2006/0061501 | A1 * | 3/2006 | Sheng et al. ................... | 341/155 |
| 2006/0176197 | A1 * | 8/2006 | McNeill et al. ............... | 341/120 |
| 2007/0262895 | A1 * | 11/2007 | Stein et al. ..................... | 341/155 |
| 2012/0050079 | A1 * | 3/2012 | Goldman et al. .............. | 341/118 |
| 2013/0106632 | A1 * | 5/2013 | Petigny et al. ................. | 341/120 |
| 2013/0241753 | A1 * | 9/2013 | Nozaki .......................... | 341/118 |

* cited by examiner

*Primary Examiner* — Linh Nguyen
(74) *Attorney, Agent, or Firm* — McDermott Will & Emery LLP

(57) ABSTRACT

Examples are provided for a method and apparatus for calibration of an analog-to-digital converter (ADC) including multiple sub-ADCs. The method includes applying a calibration signal to an input node of each sub-ADC. For each sub-ADC, a corresponding error signal is generated based on output signals of the sub-ADC and a reference sub-ADC. Each sub-ADC is calibrated based on the corresponding error signal. The reference sub-ADC is selected by: applying a non-zero input voltage signal to the input node of each sub-ADC, measuring a corresponding output signal of each sub-ADC in response to the non-zero input voltage signal, generating a deviation error based on a subtraction of a stored value from the measured output signal of each sub-ADC, and designating as the reference sub-ADC a sub-ADC from the multiple sub-ADCs based on the deviation error.

19 Claims, 9 Drawing Sheets

| | | | | | | 400A |
|---|---|---|---|---|---|---|
| CALDACVALUE | 0 | | | | | |
| CALDAC STEP | 0.0049 | | | | | |
| CALDAC Voltage, Sign = 1 | 0.0640 | | | | | |
| CALDAC Voltage, Sign = -1 | -0.064 | | | | | |

← 410

| VREF | Bad Slices | | | | Ideal | |
|---|---|---|---|---|---|---|
| | MINVREF | 0.283 | | | | |
| VOFFSET Error (Volts) | 0.030 | -0.030 | 0.030 | -0.030 | 0.000 | Volts |
| GAIN Error (Factor) | 1.200 | 1.200 | 0.800 | 0.800 | 1.000 | |
| CALDAC Sign = +ve | 119 | 56 | 30 | 4 | 48 | |
| CALDAC Sign = -ve | 6 | 60 | 46 | 82 | -49 | |

← 420

| VREF | Bad Slices | | | | Ideal | |
|---|---|---|---|---|---|---|
| | MAXVREF | 0.516 | | | | |
| VOFFSET Error (Volts) | 0.030 | -0.030 | 0.030 | -0.030 | 0.000 | Volts |
| GAIN Error (Factor) | 1.200 | 1.200 | 0.800 | 0.800 | 1.000 | |
| CALDAC Sign = +ve | 71 | 42 | 5 | 15 | 26 | |
| CALDAC Sign = -ve | 8 | 21 | 37 | 57 | -27 | |

← 430

| VREF | Bad Slices | | | | Ideal | |
|---|---|---|---|---|---|---|
| | NomVREF | 0.400 | | | | |
| VOFFSET Error (Volts) | 0.030 | -0.030 | 0.030 | -0.030 | 0.000 | Volts |
| GAIN Error (Factor) | 1.200 | 1.200 | 0.800 | 0.800 | 1.000 | |
| CALDAC Sign = +ve | 85 | 47 | 14 | 12 | 34 | |
| CALDAC Sign = -ve | 3 | 35 | 40 | 66 | -35 | |

FIG. 4A

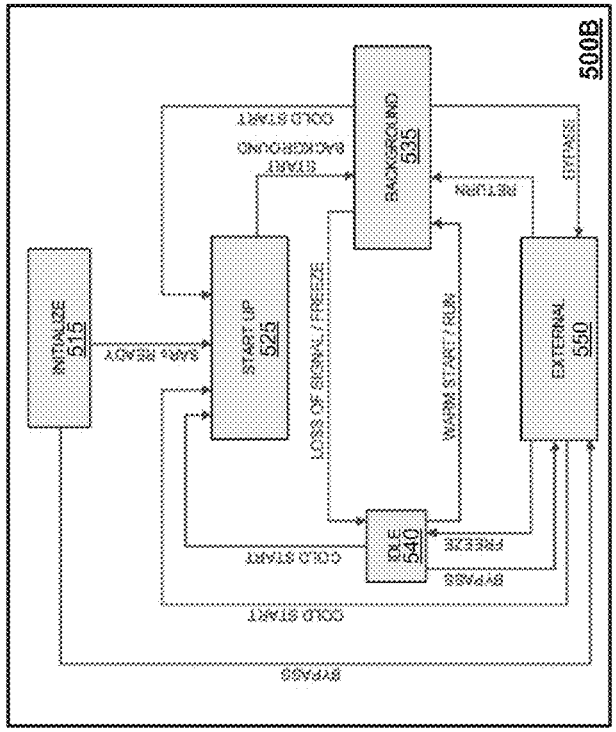
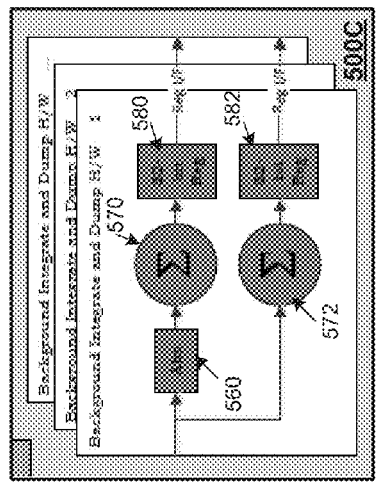
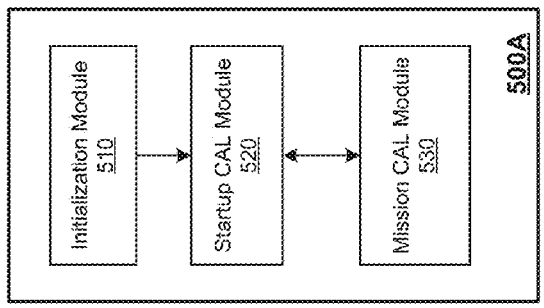
FIG. 5B
FIG. 5C
FIG. 5A

CALIBRATION OF A TIME-INTERLEAVED ANALOG-TO-DIGITAL CONVERTER

FIELD

The disclosure relates in general to mixed signal systems, and more particularly, for example, to improved calibration of a time-interleaved analog-to-digital converter (ADC).

BACKGROUND

High speed analog-to-digital converters (ADCs) can be used in advanced communication systems which include, for example, the 100 Gb/s and faster coherent optical transceivers and phased-array radar systems. High speed ADCs may be implemented by time-interleaving multiple (e.g., 128 or more) ADCs. For instance, by interleaving N sub-ADCs, a combined sampling rate (e.g., Fs) that is N time the sampling rate of each of the sub-ADCs may be achieved. However, impairments such as channel-to-channel gain-mismatch, offset-mismatch and non-uniform sampling-time impairments may result in degraded low spurious-free-dynamic-range (SFDR), and signal-to-noise-and-distortion-ratio (SNDR).

The channel-to-channel (e.g., between ADC channels) mismatch may include offset-mismatch, gain-mismatch, and sampling-time mismatch. The offset-mismatch, for example, can cause spurious continuous-wave (CW) unmodulated tones to appear at frequencies corresponding to multiples (e.g., 0 1 2 . . . (N−1)) of the Fs/N ratio. The gain mismatch, for instance, can result in amplitude-modulated (AM) sidebands generated from mixing of the input signal with different signal-path gains associated with each individual sub-ADC channel, whereas the sampling-time mismatch can cause frequency-dependent phase-modulation of the input signal because of different sampling-times associated with each individual sub-ADC channel. Existing solutions for mitigating these impairments are by design, at the analog circuit level. This often leads to large chip-area, high cost, high power-consumption, and undesired high design-complexity.

The description provided in the background section, including without limitation, any problems, features, solutions or information, should not be assumed to be prior art merely because it is mentioned in or associated with the background section. The background section may include information that describes one or more aspects of the subject technology.

SUMMARY

In one aspect of the disclosure, example methods and apparatus are provided for calibration of time-interleaved analog-to-digital converters (ADCs). The calibrations of the subject technology meet the ADC's performance targets such as effective number-of-bits (ENOB), spurious-free-dynamic-range (SFDR), signal-to-noise-and-distortion-ratio (SNDR), and other performance targets. These calibrations can be performed with advantageous features including, but not limited to, not degrading baseline performance (e.g., using minimally invasive sense and control features that are not disruptive to sensitive high-speed analog circuits), flexibility in working with many design architectures and circuit implementations, robustness (e.g., having stable feedback circuit paths and using algorithms that are free from convergence issues), and minimal overhead (e.g., additional chip-area, power consumption, and circuit complexity). The disclosed solutions can take advantage of the compact digital circuit capability of deep-submicron processes CMOS processes (e.g., 32 nm silicon-on-insulator (SOI) process with a gate density of approximately 2 million gates/mm$^2$). The subject technology can further expand the product's design space across both analog blocks and digital calibration, with block performance driven on-demand by the system requirements (e.g., without over-design such as inclusion of unnecessary parts and elements).

One or more implementations of the subject disclosure are illustrated by and/or described in connection with one or more figures and are set forth in the claims.

The description in this summary section may provide some illustrative examples of the disclosure. This section is not intended to be a broad overview or to identify essential elements of the disclosure.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

BRIEF DESCRIPTION OF THE DRAWINGS

FIGS. 4A and 4B are examples of a table and a module for selection of the reference sub-ADC of FIG. 1.

FIGS. 5A and 5B are a high-level architectural diagram of an example of a calibration system and an associated finite-state-machine.

FIG. 5C is a block diagram of an example of a mission-mode telemetry module.

DETAILED DESCRIPTION

Figure 2:
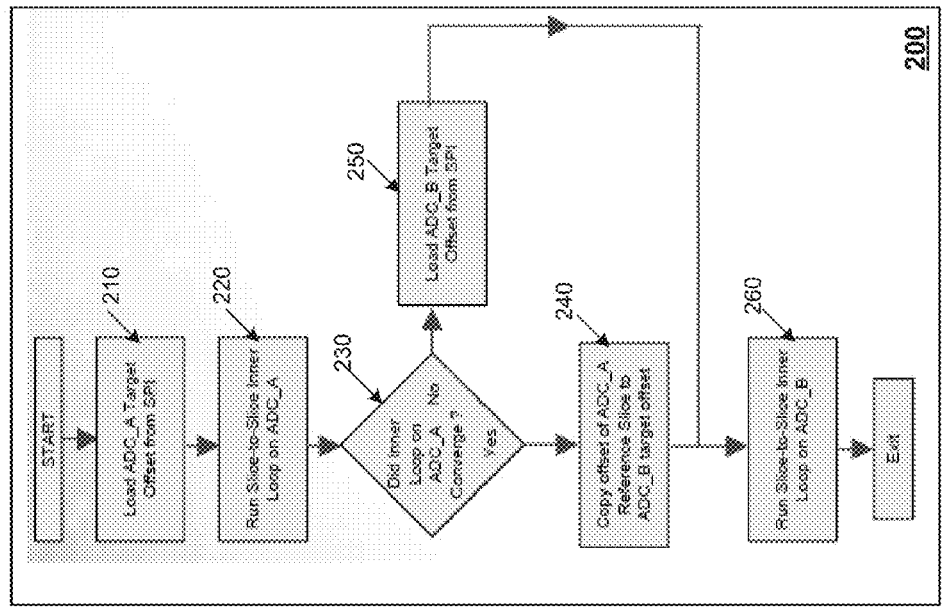
FIG. 2 is a flow diagram of an example of a method for an outer-loop calibration.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding. Please note that the term "example" is used herein as a noun or an adjective.

In one or more aspects, the subject technology is directed to methods and implementations for calibration of an analog-to-digital converter (ADC) to mitigate ADC impairments including offset and gain mismatches. In some aspects, the ADC may be a time-interleaved, ultra-high speed ADC envisioned for advanced communication systems including, for example, 100 Gb/s and faster coherent optical transceivers and phased array radar systems. The ADC may be implemented with a number of (e.g., N such as 128) time-interleaved sub-ADCs to achieve a sampling rate that is N times higher than that of the individual sub-ADCs.

The mismatches between various sub-ADCs, such as gain and offset mismatches, and non-uniform sample-timing impairments, however, may result in degraded signal-to-noise and distortion ratio (SNDR) and spurious-free dynamic range (SFDR) values. For example, the offset mismatch may cause creation of spurious continuous-wave (CW) unmodulated tones (e.g., at 0, 1, 2 ... (N−1) times the sampling rate ($F_s$/N) of each sub-ADC). The gain mismatch, for instance, can result in unwanted amplitude modulated (AM) sidebands of an input signal mixed with tones at frequencies at 0, 1, 2 ... (N−1) times ($F_s$/N). Further, the sampling-time mismatch may lead to frequency-dependent mixing of the input signal with tones at frequencies at 0, 1, 2 ... (N−1) times ($F_s$/N). Mitigating these impairments by design at an analog circuit level requires stringent analog specifications that results in large chip-area, high power-consumption, and high design-complexity.

In one or more implementations, the subject technology alleviates impairments associated with the gain-mismatches and offset-mismatches, and non-uniform sampling-time impairments by calibration that meets the ADC's effective number of bits (ENOB), SFDR, and other performance targets. The disclosed calibration solutions are minimally invasive in terms of the applied sensing and controlling mechanism and do not disrupt sensitive high-speed analog circuits. Further, the subject technology provides a robust solution with no convergence issues in the applied algorithms and with stable feedback circuit paths that works with an arbitrary architecture and circuit implementation with minimal overhead (e.g., chip area, power consumption, or circuit complexity). In one or more implementations, the subject technology includes a number of advantageous features. For example, it can take full advantage of the compact digital circuit capability of the deep sub-micron CMOS processes (e.g., 32 nm silicon-on-insulator (SOI) process with a gate density of ~2 million gates/mm$^2$). The disclosed solution can expand design space across both analog circuit blocks and digital calibration. In this way block performance can be driven on-demand by the system (e.g., not overdesigned).

Figure 1:
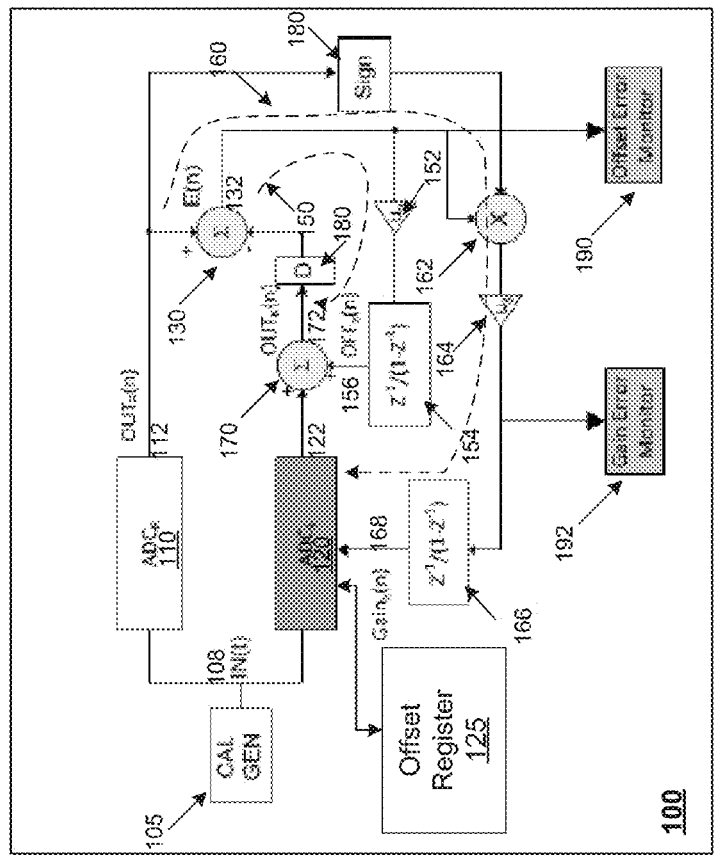
FIG. 1 is an architectural diagram of an example of an apparatus for calibration of a time-interleaved analog-to-digital converter (ADC).

FIG. 1 is an architectural diagram of an example of an apparatus 100 for calibration of a time-interleaved ADC. The ADC may include a number of (e.g., N such as 128) sub-ADCs, an example of which is shown as the ADC 120 (e.g., $ADC_k$). The apparatus 100 calibrates gain and offset of the ADC 120 (e.g., a sub-ADC under-calibration) relative to a reference sub-ADC 110, which is selected from the sub-ADCs to serve as a reference for gain and offset calibration of the remaining sub-ADCs. In a single-ended ADC implementation (e.g., where the ADC has a single analog input), to select the reference sub-ADC 110 from the sub-ADCs, an input node of each sub-ADC is shorted to ground potential and then an offset of that sub-ADC is measured. The sub-ADC with the lowest offset (e.g., with respect to a target offset) is selected as the reference sub-ADC 110. In a differential ADC implementation (e.g., where the ADC has a pair of complementary positive and negative differential inputs), the two differential (e.g., positive and negative) inputs to the ADC are shorted to each other and the offset of the sub-ADC is measured.

The apparatus 100 performs gain and offset calibration of the sub-ADC 120 through a sequence of measurements performed using a gain-correction path 160 and an offset-correction path 150 and a calibration-signal 108 (e.g., IN(t)) generated by a calibration-signal generator 105. For example, in an nth measurement sequence (e.g., iteration) of a calibration loop, in a summation block 130, an output signal 172 (e.g., $OUT_k(n)$) of the summation block 170, which is stored in a memory element (e.g., a Flip-flop) 180, is subtracted from an output 112 (e.g., $OUT_k(n)$) of the reference ADC 110 to generate an error signal 132. The offset-correction path 150 and the gain-correction path 160 act to minimize the difference between the output signal 112 of the reference sub-ADC 110 and the output signal 122 of the sub-ADC 120 in the mean-square sense. The offset-correction path 150 includes a multiplier 152 and an error accumulator 154. The multiplier 152 multiplies the error signal 132 by a quantized fraction (e.g., 0.01) and passes the result to the error accumulator 154 that generates an offset-error signal 156 (e.g., $OFF_k(n)$). The offset-error signal 156 is added, in the summation block 170, to the output signal 122 of the sub-ADC 120 to generate the output signal 172. After a number of sequences of measurements, the offset-error correction loop of the calibration loop converges and the offset-error signal 156 approaches a constant value (e.g., nearly zero), which is the estimated offset-mismatch of the sub-$ADC_K$ under calibration relative to the reference sub-$ADC_R$.

The gain-correction path 160 includes a sign block 180, a multiplication block 162, a multiplier 164 and an accumulator 166. The sign block 180 derives the sign of the output signal 112 and generates a sign signal (e.g., +1 or −1), which is then multiplied through the multiplication block 162 by the error signal 132 to generate an absolute value of the error signal 132. The absolute value of the error signal 132 is then multiplied by a quantized fraction (e.g., in block 164) and the result is passed to the error accumulator 166 that generates a gain-error signal 168 (e.g., $Gain_k(n)$). The gain-error signal 168 is used to digitally adjust the gain of the sub-ADC 120. In some aspects, the gain of the sub-ADC 120 is corrected by adjusting a reference voltage of the sub-ADC 120, for example, by changing input digital codes to a gain-adjustment digital-to-analog converter (DAC) that generates the reference voltage for the sub-ADC. In this way, the gain correction including the modified input digital code to the gain-adjustment DAC can be stored in gain-adjustment register 125 and retrieved at a later time. It is understood that the gain-correction and offset-correction loops can be performed concurrently. The operation of the apparatus 100 through various measurement sequences can be further understood from the update equations below:

$$OFF_k(n) = OFF_k(n-1) + \mu_O * E(n) \qquad (1)$$

$$Gain_k(n) = Gain_k(n-1) + \mu_G * E(n) * Sign(OUT_R(n)) \qquad (2)$$

$$E(n) = OUT_R(n) - OUT_k(n) \qquad (3)$$

Where $\mu_O$ and $\mu_G$ are step sizes (e.g., quantization factors) and can control convergence speed, stability and accuracy of the calibrations and, in some implementations, can be controlled by software.

In one or more implementations, for better stability and convergence, the calibration signal 108 has at least two distinct values. The calibration signal 108 has to include white noise to enable the calibration loops to match the ADC channels (e.g., sub-ADCs) below the LSB level. Examples of the calibration signal 108 include a square wave with added white noise.

In some aspects, an offset-error monitor block 190 and a gain error-monitor block 192 can automatically detect a convergence of the offset-correction loop and the gain-correction loop respectively, as described in more detail below.

FIG. 2 is a flow diagram of an example of a method 200 for ADC-to-ADC calibration. In addition to the inter-sub ADC calibration (e.g., inner-loop) explained above with respect to FIG. 1, the subject technology allows for calibrating between two or more time-interleaved ADCs (e.g., outer-loop calibration). The example outer-loop calibration as shown in method 200 compares two ADCs (e.g., ADC-A and ADC-B), each of which is a time-interleaved ADC comprising of two or more sub-ADCs. The method 200 starts with loading a target offset values for the ADC-A from an interface (e.g., a serial-to-parallel interface (SPI)) (210). Next, an inner loop calibration between sub-ADCs (e.g., slices) of ADC-A is performed (220). In a control block 230, if the inner loop calibration of ADC-A converged, the offset of the reference sub-ADC of the ADC-A is used as a target offset for ADC-B (240). Otherwise, a target offset for ADC-B is loaded from the SPI (250). Next, an inner loop calibration is performed for the ADC-B using the target offset for ADC-B (260), which concludes the method 200.

Figure 3A:
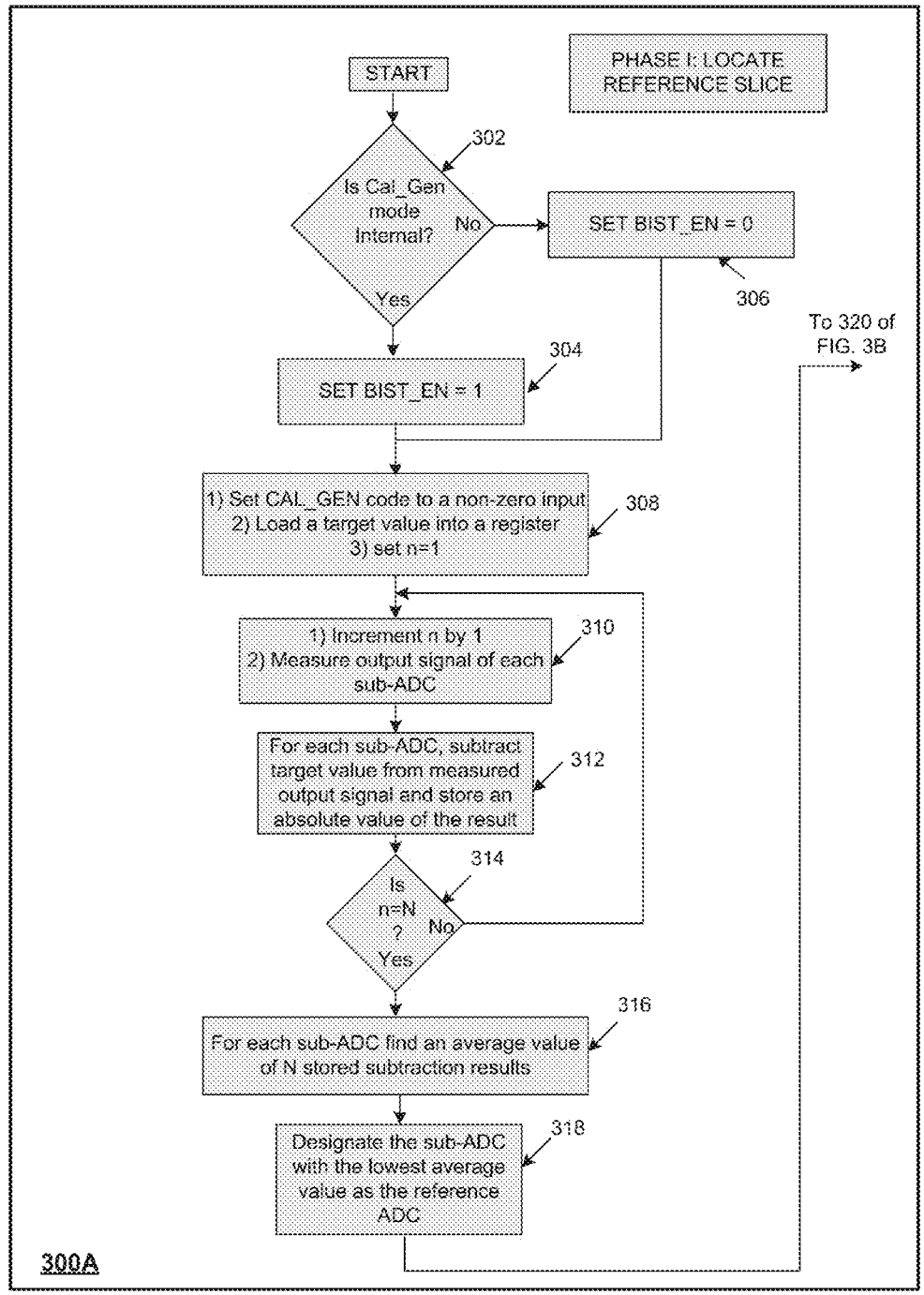
FIGS. 3A through 3C are flow diagrams of an example of a method for an inner loop calibration.
Figure 3B:
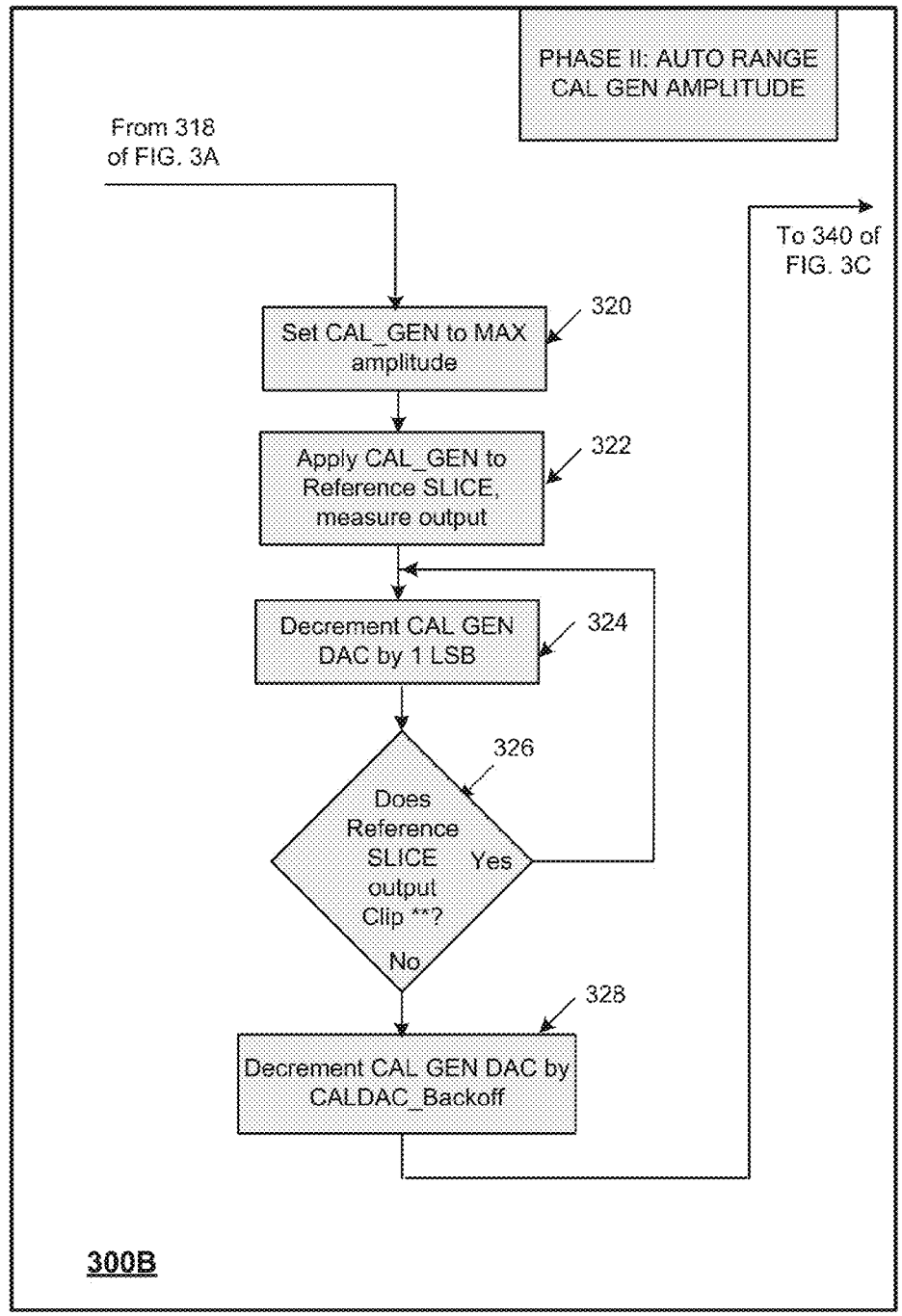
Figure 3C:
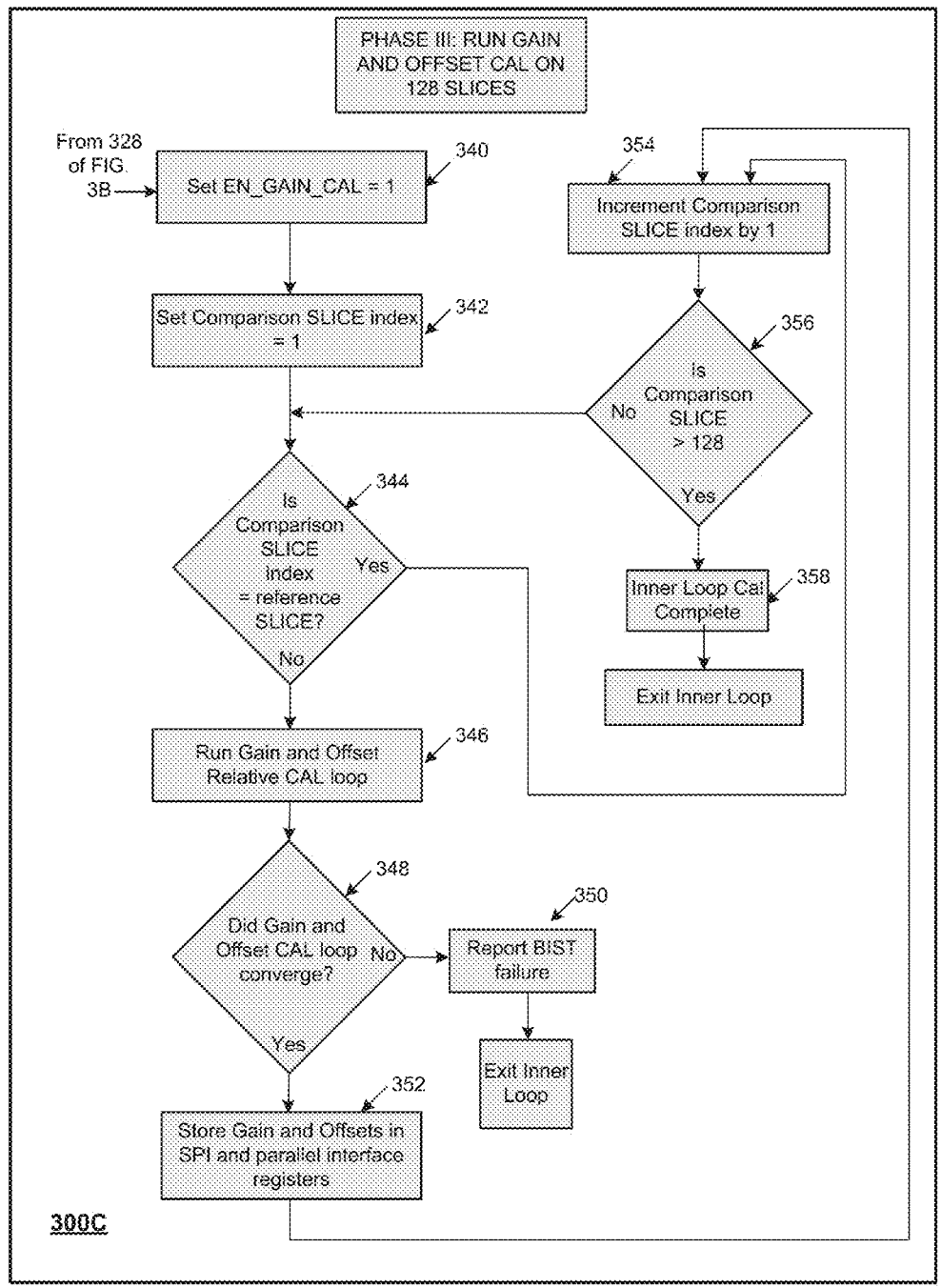

FIGS. 3A through 3C are flow diagrams of an example of a method for inter-loop calibration. The flow diagram 300A of FIG. 3A, 300B of FIG. 3B, and 300C of FIG. 3C, respectively show three different phases of the inner loop calibration that are performed by the apparatus 100 of FIG. 1. The flow diagram 300A, for example, illustrates the reference sub-ADC (e.g., slice) selection process, among a number of (e.g., 128) sub-ADCs, in which zero differential inputs are applied to all the sub-ADCs and offset calibration is run to find a sub-ADC that has an offset that is closest to the target offset value. This sub-ADC is designated as the reference sub-ADC. The reference sub-ADC selection process starts with control block 302 where it is determined whether a calibration signal generation mode (e.g., Cal-Gen mode) is internal or not. If the Cal-Gen mode is internal, a built-in self-test (BIST) is enabled (304), otherwise, the BIST is disabled (306). Next, Gal-Gen code is set to a non-zero value, a target value (e.g., an ideal value) for the output signal of the sub-ADC is loaded into a register, and a sample count n is set to one (308). As explained in more detail below, the non-zero value is selected such that for all combinations of offset error, gain error, and Vref values, output signal of each sub-ADC is bound by +127 and −127. In the next step, the sample count is incremented by one and the output signal of each ADC is measured (310). Then, for each sub-ADC, the stored target value is subtracted from the measured output signal and an absolute value of the subtraction result (e.g., a deviation error) is stored (312). Next, the sample count is compared with N (e.g., 128 or 256) (314) and if n is less than N, control is passed to block 310. Otherwise, for each sub-ADC, an average value of the stored deviation errors of block 312 is determined (316). Finally, the sub-ADC with the lowest average stored deviation error is designated as the reference ADC (318).

The flow diagram 300B illustrates an auto range calibration signal generation (Cal-Gen) amplitude setting process, which follows block 318 of FIG. 3A. Initially, the Cal-Gen amplitude is set to a maximum level (320) and applied to the reference sub-ADC selected in the flow diagram 300A, and a corresponding output signal is measured (322). Next, the Cal-Gen amplitude is decremented (e.g., by one LSB) (324) and it is determined whether the reference sub-ADC is clipped or not (326). The clipping of the reference sub-ADC may be detected (e.g., during the startup calibration) by a clipping indicator that is configured to check the status of the reference sub-ADC. If the reference sub-ADC is clipped, control is passed to block 324. Otherwise, Cal-Gen amplitude is decremented (e.g., by one LSB) (328) and the next process of gain and offset calibration method 300C is started using the selected reference sub-ADC and the Cal-Gen amplitude set in the methods 300A and 300B.

The method 300C starts with enabling the gain-error correction loop (e.g., by setting EN-GAIN-CAL=1) (340). Next, a comparison sub-ADC index (e.g., an index associated with a sub-ADC or slice under calibration) is set to one (342), and it is determined whether the comparison sub-ADC index is equal to the reference sub-ADC (e.g., an index associated with a reference slice) (344). If the comparison sub-ADC index is equal to the reference sub-ADC, control is passed to step 354. Otherwise, gain and offset correction loops are performed (346), and it is determined whether these loops converged (348). If the loops did not converge, the event is reported as a BIST failure (350) and the inner loop is exited. Otherwise, gain and offset values are stored in registers (e.g., interface registers or SPI) (352) and the comparison sub-ADC index is incremented by one (354), so that the next under-calibration sub-ADC can be selected. Then it is determined whether the comparison sub-ADC index has reached the number of sub-ADCs in the time-interleaved ADC 356). If the comparison sub-ADC index has reached the number of sub-ADCs in the time-interleaved ADC, e.g., 128, the inner loop calibration is complete (358) and is exited. Otherwise, the control is passed to block 344 for the calibration to continue.

Figure 4B:
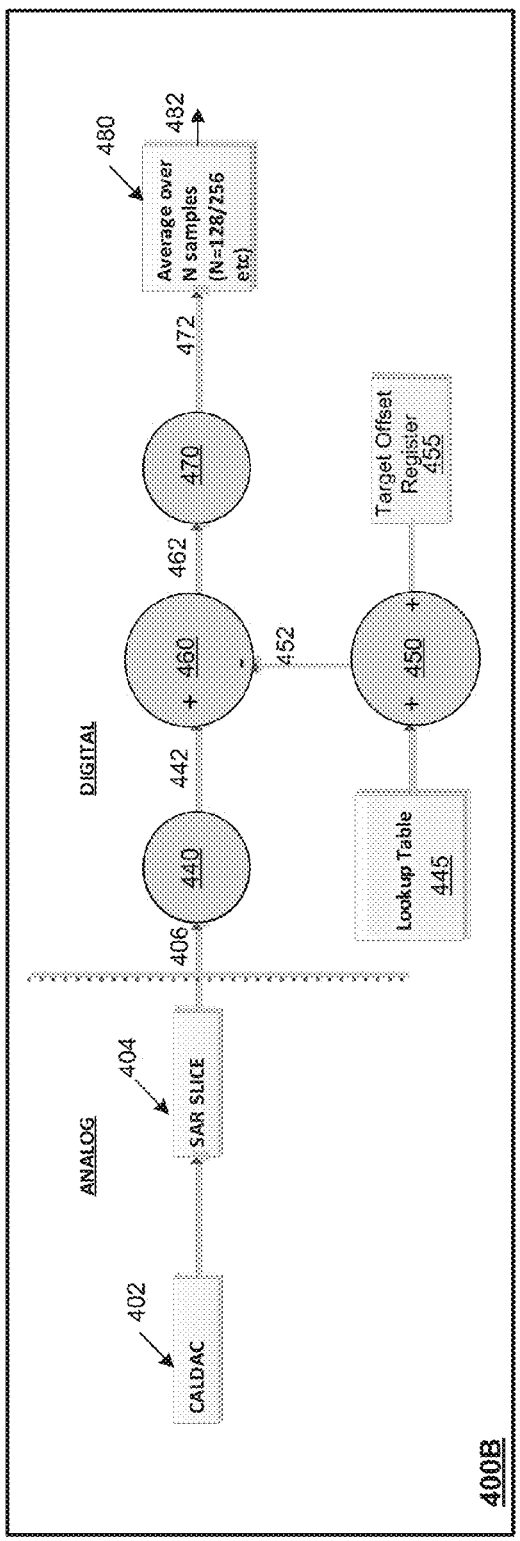
Figure 6:
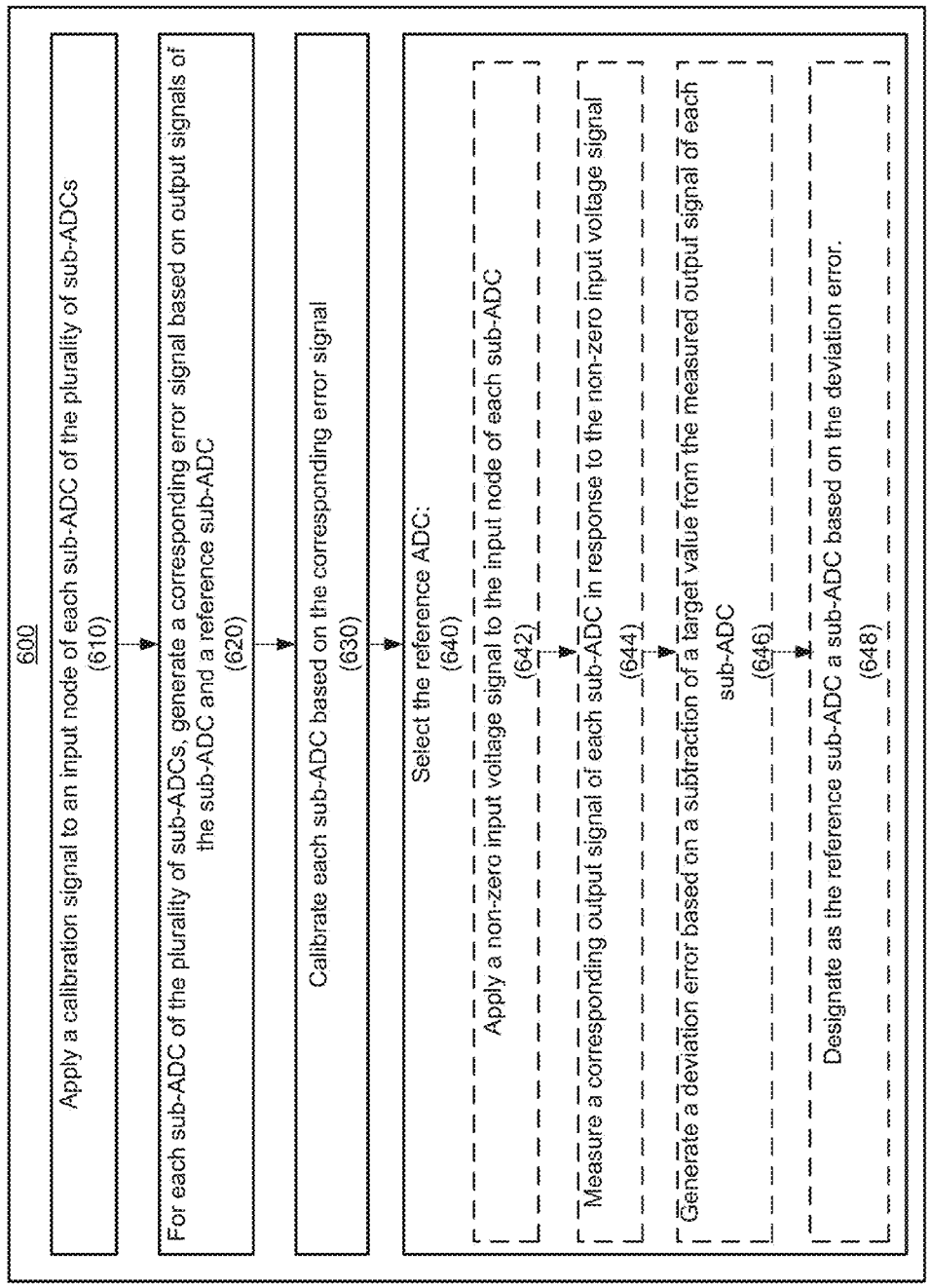
FIG. 6 is a flow diagram illustrating an example of a method for calibration of an ADC.

FIGS. 4A and 4B are examples of a table 400A and a module 400B for selection of the reference sub-ADC of FIG. 1. The subject solution, as described above with respect to flow diagram 300A of FIG. 3A, selects a reference sub-ADC for correcting offset and gain errors of other sub-ADCs. The reference sub-ADC is selected by a) measuring output signals of the sub-ADCS, while output of the calibration DAC (e.g., CALDAC), which is coupled to input nodes of the sub-ADCs, has a non-zero value; and b) designating the sub-ADC having an output signal with the lowest deviation with respect to a target value (e.g., desired or ideal value) as the reference sub-ADC. This is to make sure that the reference sub-ADC is a sub-ADC with the lowest gain and offset impairment. For each sub-ADC, a nominal LSB output (e.g., $LSB_{out}$, an unsigned binary number) can be estimated from:

$$LSB_{Out}=127.5*(1+((V_{in}+V_{offsetErr}+V_{noise})*1.667/V_{ref})))K_{GainErr} \quad (1)$$

where $V_{in}$ is the input voltage to the sub-ADC, $V_{offsetErr}$ is the offset error (positive or negative), $V_{noise}$ is the input referred noise, $V_{ref}$ is the reference voltage for the sub-ADC, and $K_{GainErr}$ is the gain error, which can be greater than or smaller that the nominal gain value (e.g., 1). For any given input voltage $V_{in}$, a maximum and a minimum of the $LSB_{out}$ are given as:

$$LSB_{OutMax}=127.5*(1+((V_{in}+V_{offsetErrMax})*1.667/V_{refMin})))K_{GainErrMax} \quad (2)$$

$$LSB_{OutMin}=127.5*(1+((V_{in}+V_{offsetErrMin})*1.667/V_{refMax})))K_{GainErrMin} \quad (3)$$

where $V_{offsetErrMax}$ and $V_{offsetErrMin}$ are respectively the maximum and minimum values of the offset error, $V_{refMax}$ and $V_{refMax}$ are respectively the maximum and minimum values of the reference voltage, and $K_{GainErrMax}$ and $K_{GainErrMin}$ are respectively the maximum and minimum values of the gain error.

The CALDAC output voltage (e.g., output voltage of the calibration DAC) value, for the purpose of reference sub-ADC selection, is chosen such that for all combinations of practical values of offset error, gain error, and Vref, the sub-ADC $LSB_{out}$ is always bound by +127 and −128. The table 400A shows results for a number of runs with a range of CALDAC output voltage values, for example starting from zero and incrementing by 0.0049 in each step. Section 410 includes results for a case of a $V_{refMin}$=0.283, $V_{offsetErrMax}$=0.030V, $V_{offsetErrMin}$=−0.030V, $K_{GainErrMax}$= 1.2, and $K_{GainErrMain}$=0.8. Sections 420 and 430, respectively, include results for $V_{refmax}$=0.516 and nominal $V_{ref}$=0.4, while the values for the $V_{offsetErrMax}$, $V_{offsetErrMin}$, $K_{GainErrMax}$ and $V_{offsetErrMin}$ are the same as in section 410. The $LSB_{out}$ results shown for ideal and bad sub-ADCs, as determined from above expressions (1), (2), and (3), are within the acceptable range (−127 to +128).

The module 400B includes a first portion and a second portion. In some aspects, the first and the second portions can be, respectively, implemented in analog and digital domains. The analog domain portion includes the CALDAC 402 and a sub-ADC (e.g., SAR slice) 404. The digital portion includes a first absolute-value block 440, a sum block 450, a subtraction block 460, a second absolute-value block 470, and an average block 480. The CALDAC 402 can be driven, for example, at values provided in table 400A to generate a non-zero signal at an output of the sub-ADC 404. The expected (e.g., ideal) value for the sub-ADC 404 output can be determined, based on expression (1) for the nominal $LSB_{out}$, and encoded in a look-up table 445 or a register. The register has to be programmed before triggering each startup calibration cycle.

The first absolute-value block 440 provides an absolute value 442 of the sub-ADC 404 output 406. The summation block 450 provides a reference value 452 from either the lookup table 445 or a target offset register 455. In the subtraction module 460, the reference value 452 is subtracted from the absolute value 442 to generate the deviation error 462. The absolute value 472 of the deviation error 462 is determined by the second absolute value block 470. The absolute value 472 of the deviation error 462 for a number of (e.g., N, such as 128 or 256) samples are averaged by the average block 480 to generate the average deviation error 482 for the sub-ADC 430. Similarly, the average deviation error 482 is determined for all sub-ADCs, and the sub-ADC with the lowest average deviation error is selected as the reference ADC.

FIGS. 5A and 5B are a high-level architectural diagram of an example of a calibration system and an associated finite-state-machine. The calibration system 500A includes an initialization module 510, a start-up calibration module 520, and a mission calibration module 530. The initialization module 510, among other tasks, detects the status of the sub-ADCs after the system (e.g., a chip) is turned on and provides the status to start-up calibration module 520. The startup calibration module 520 performs a startup calibration after the initialization of the chip or following a cold start of the chip. The mission calibration module 530 performs the background calibration after the startup calibration and during normal operation of the chip, subsequent to a warm start following an idle state, or in response to an external return command. The startup calibration and the mission calibration are bypassable by external commands received from, for example, an interface or a controller. The command, for instance, may be a freeze command.

The finite-state-machine 500B shows the envisioned calibration states and the transitions between the states. The states of the finite-state-machine 500B include an initialization state 515, a startup state 525, a background state 535, an idle state 540, and an external state 550 that allows a user to intervene and bypass the calibration. The idle state 540 is reached after a freeze resulting from an external freeze command or a loss of signal (e.g., pulling out of a cable buy a user). The external state 550 is a state that the calibration system is under external control. The transitions between states are self-explanatory and include a cold start, a freeze, and a warm start that are described herein. The cold start is when the chip is started from a stopped or frozen state (e.g., resulting from removing a cable) and any previously stored offset correction values may not be applicable. In the warm start, however, the chip is already warm (e.g., running for example in an idle state) and the previously stored offset correction values may be usable.

FIG. 5C is a block diagram of an example of a mission-mode telemetry module 500C. The mission-mode telemetry module 500C provides the mission-mode telemetry data associated with each sub-ADC. The mission-mode telemetry data includes serial data resulting from accumulation of calibration output data of the respective sub-ADC over a predetermined period of time during a normal operation of the ADC. The mission-mode telemetry data enables remote adjustment of one or more software-controlled calibration parameters of the sub-ADC during the mission mode calibration. The mission mode calibration is intended to work on the user data, which may be random and wide-sense stationary data.

The mission-mode telemetry module 500C includes an absolute-value block 560, a first integration block 570, a second integration block 572, a first register 580 (e.g., a 32-bit register), and a second register 582 (e.g., a 32-bit register). In some aspects, a clipping indicator (not shown in FIG. 5C for simplicity) may also be included to indicate if the data is outside of the ADC's normal operating range during mission mode calibration. During mission-mode calibration, when the user data overloads the ADC, a fault condition may occur that may make the calibration information telemetry invalid. The clipping indicator can be used to inform the user of this fault condition and is an additional piece of data to be used outside of the ADC. In response, the user may decide to not update the gain and offset (mission mode) or delay that update until the data returns to normal when the clipping no longer occurs. The clipping indicator may monitor all ADC outputs (e.g., 112, 122, of FIG. 1) and operate during the entire mission mode. In one or more implementations, every sub-ADC may include a clipping indicator. The absolute-value block 560 receives, during the normal operation of the ADC, gain data from each sub-ADC (e.g., 120 of FIG. 1) and generates absolute values of the gain data (e.g., 168 of FIG. 1) that can result from application of the user data during the mission mode. The first integration block 570 integrates the absolute values the gain data over the predetermined period of time during the normal operation of the ADC. The integrated absolute values of the gain data that represents the variance or sigma of the user data are then stored in the first register 580, and can be used to detect loss of signal (LOS). For example, the LOS can be determined when an output of the register 580 is below a predefined (e.g., by the user) target threshold, and the calibration can be similarly frozen as in the case of clipping. The second integration block 572 integrates offset data (e.g., 156 of FIG. 1), which can result from application of the user data to each sub-ADC over the predetermined period of time, during the mission mode. The integrated offset data are stored in the second register 582. In some aspects, the stored gain data and offset data can be used to remotely adjust one or more software-controlled calibration parameters of each sub-ADC during the mission mode calibration.

The subject technology includes a number of advantageous features over the existing solutions. For example, the subject solution works with input signals outside the first Nyquist zone, which cannot be achieved by existing solutions using timing skew calibration. Further, the disclosed solution uses the even versus odd gain mismatch coefficients to detect duty cycle during power-up and mission mode. During the startup, the duty cycle can be corrected while processing the low-frequency CALGEN signal of the subject technology. In other words, a low-frequency signal can be used to detect duty-cycle (e.g., timing) mismatch of the time-interleaved ADCs of the subject technology. Further, the robust power-up calibration method of the subject solution works even when no input is applied to the ADC, as compared to the existing solutions that require user input in the first Nyquist zone for the timing mismatch detection. The telemetry data sent from the ADC of the subject technology can be 32-bit accumulated data (e.g., generated by registers 580 and 582) that reduces the amount of information sent from the ADC to an off-chip device or circuit (e.g. processor).

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

Figure 7:
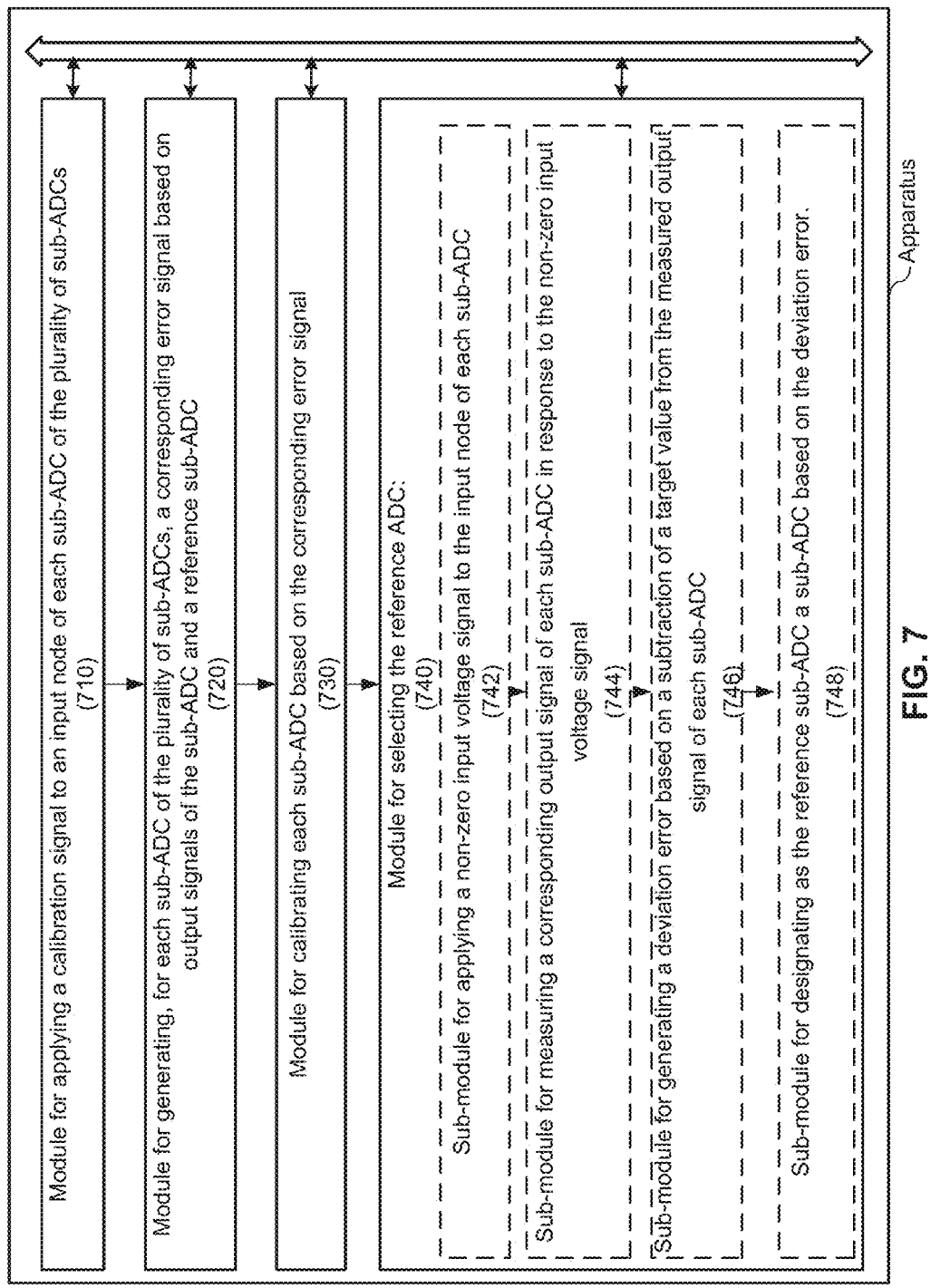
FIG. 7 is a diagram illustrating an example of an apparatus including modules for calibration of an ADC.

1. A method (e.g., 700 of FIG. 7) for calibration of an analog-to-digital converter (ADC) including a plurality of sub-ADCs, comprising:

selecting a reference sub-ADC from the plurality of sub-ADCs based on a non-zero input signal applied to each sub-ADC, a corresponding output signal from each sub-ADC, and a stored value (e.g., 740 of FIG. 7);

applying a calibration signal to an input node of each sub-ADC of the plurality of sub-ADCs, other than the reference ADC (e.g., 710 of FIG. 7);

for each sub-ADC of the plurality of sub-ADCs, other than the reference ADC, generating a corresponding error signal based on output signals of the sub-ADC and a reference sub-ADC (e.g., 720 of FIG. 7); and calibrating each sub-ADC of the plurality of ADCs, other than the reference ADC, based on the corresponding error signal (e.g., 730 of FIG. 7).

2. The method of clause 1 or any other clauses, wherein selecting the reference ADC from the plurality of sub-ADCs comprises:

applying the non-zero input voltage signal to the input node of each sub-ADC (e.g., 742 of FIG. 7);

generating a deviation error based on a subtraction of a stored value from the measured output signal of each sub-ADC (e.g., 746 of FIG. 7); and designating as the reference sub-ADC a sub-ADC from the plurality of the sub-ADCs based on the deviation error (e.g., 748 of FIG. 7), and wherein:

the stored value comprises an expected value for the output signal of a desired sub-ADC in response to the non-zero input voltage signal, the deviation error comprises an average of N subtraction results corresponding to N measured output signals of each sub-ADC, and N comprises a positive integer.

3. The method of clause 2 or any other clauses, wherein generating the corresponding error signal based on the output signals of that sub-ADC and the reference sub-ADC comprises using a calibration loop that acts to reduce a mean-square difference between the output signals of that sub-ADC and the reference sub-ADC.

4. The method of clause 1 or any other clauses, further comprising adjusting an amplitude of the calibration signal prior to applying the calibration signal, wherein adjusting the amplitude of the calibration signal comprises:

(a) setting the amplitude of the calibration signal to a maximum value;

(b) applying the calibration signal to an input node of the reference sub-ADCs and measuring a corresponding output signal;

(c) determining whether the corresponding output signal is clipped;

(d) in response to the determination that the corresponding output signal is clipped, decrementing the amplitude of the calibration signal by one least significant bit (LSB) and continuing with step (b); and (e) in response to the determination that the corresponding output signal is not clipped, decrementing the amplitude of the calibration signal by one least significant bit (LSB).

5. The method of clause 1 or any other clauses, further comprising providing mission-mode telemetry data, wherein:

mission-mode telemetry data is associated with each sub-ADC and comprises serial data resulting from accumulation of calibration output data of that sub-ADC over a predetermined period of time during a normal operation of the ADC, the mission-mode telemetry data enables remote adjustment of one or more software-controlled calibration parameters of that sub-ADC during a mission mode calibration.

6. The method of clause 5 or any other clauses, wherein providing mission-mode telemetry data comprises:

receiving, during the normal operation of the ADC, calibration output data from the sub-ADC, the calibration output data comprising offset data and gain data;

generating an absolute value of the gain data and integrating the absolute values the gain data over the predetermined period of time during an normal operation of the ADC;

copying the integrated absolute values of the gain data into a first register;

integrating the offset data over the predetermined period of time during an normal operation of the ADC; and copying the integrated offset data into a second register.

7. The method of clause 1 or any other clauses, further comprising generating for each sub-ADC a corresponding offset-error signal based on the corresponding error signal, wherein:

generating the corresponding offset-error signal comprises using a first software-controlled parameter and a first accumulator in an offset-calibration loop, the offset-calibration loop comprises calibrating each sub-ADC based on the corresponding error signal by adjusting an offset of each sub-ADC at an output node of that sub-ADC in digital domain, and adjusting the offset of each sub-ADC at the output node of that sub-ADC comprises generating a new value for the output signal of the sub-ADC by combining the corresponding offset-error signal with a previous value of the output signal of the sub-ADC.

8. The method of clause 1 or any other clauses, further comprising generating for each sub-ADC a corresponding gain-error signal based on the corresponding error signal in a gain-calibration loop, wherein:

the gain-calibration loop comprises calibrating each sub-ADC based on the corresponding error signal by adjusting a corresponding reference voltage of each sub-ADC, adjusting the corresponding reference voltage of each sub-ADC comprises modifying an input digital code to a corresponding gain-adjustment digital-to-analog converter (DAC) that generates the corresponding reference voltage of each sub-ADC, modifying the input digital code to the corresponding gain-adjustment DAC is based on the corresponding gain-error signal, and generating the corresponding gain-error signal comprises taking a product of three terms comprising the corresponding error signal, a sign of the output signal of the reference sub-ADC, a software-controlled parameter, and accumulating the product in a second accumulator, storing a corresponding gain-correction including the modified input digital code in gain-adjustment DACs for later retrieval, automatically detecting a convergence of the gain-calibration loop.

10. The method of clause 1 or any other clauses, wherein:
the calibration of the ADC comprises a startup calibration and a background calibration,
the startup calibration is performed after an initialization of a chip or following a cold start of the chip,
the background calibration is performed after the startup calibration and during normal operation of the chip, subsequent to a warm start following an idle state, or in response to an external return command,
the startup calibration and the background calibration are bypass-able by external commands, and
the idle state is reached after a freeze resulting from an external freeze command or a loss of signal.

11. An apparatus (e.g., 100 of FIG. 1) for calibration of an analog-to-digital converter (ADC) including a plurality of sub-ADCs (e.g., 120 of FIG. 1), comprising:
a reference sub-ADC (e.g., 110 of FIG. 1) configured to be selected from the plurality of sub-ADCs;
a calibration-signal generator (e.g., 105 of FIG. 1) configured to provide a calibration signal (e.g., 108 of FIG. 1) at an input node of each sub-ADC of the plurality of sub-ADCs; and
a gain-correction path (e.g., 160 of FIG. 1) configured to generate, for each sub-ADC of the plurality of sub-ADCs, other than the reference sub-ADC, a corresponding error signal (e.g., 132 of FIG. 1) based on output signals of the sub-ADC (e.g., 122 of FIG. 1) and the reference sub-ADC (e.g., 112 of FIG. 1), wherein
each sub-ADC, other than the reference ADC, is configured to be calibrated based on the corresponding error signal, and
the apparatus is configured to provide selection of the reference sub-ADC from the plurality of sub-ADCs based on a non-zero input signal applied to each sub-ADC, a corresponding output signal of each sub-ADC, and a stored value.

12. The apparatus of clause 11 or any other clauses, the apparatus is configured to provide selection of the reference sub-ADC from the plurality of sub-ADCs based on:
applying the non-zero input voltage signal to the input node of each sub-ADC (e.g., 406 of FIG. 4B);
measuring the corresponding output signal (e.g., 406 of FIG. 4B) of each sub-ADC in response to the non-zero input voltage signal;
generating a deviation error (e.g., 482 of FIG. 4b) based on a subtraction of a stored value (e.g., 452 of FIG. 4B) from the measured output signal (e.g., 442 of FIG. 4B) of each sub-ADC; and designating as the reference sub-ADC a sub-ADC from the plurality of the sub-ADC based on the deviation error, wherein:
the apparatus further comprises:
one of a register or a look-up table configured to store an expected value for the output signal of a desired sub-ADC in response to the non-zero input voltage signal,
a subtraction block configured to subtract the stored expected value for the output signal of the desired sub-ADC from the measured output signal of each sub-ADC to generate a subtraction result;
an absolute module block configured to generate an absolute value of the subtraction result;
the processor configured to generate an average of N subtraction results corresponding to N measured output signals of each sub-ADC, wherein N comprises a positive integer.

13. The apparatus of clause 11 or any other clauses, wherein the gain-correction path is configured to act to reduce a mean-square difference between the output signals of that sub-ADC and the reference sub-ADC.

14. The apparatus of clause 11 or any other clauses, wherein the gain-correction path is configured to determine an amplitude for the calibration signal by:
applying the calibration signal with an initial amplitude value to the reference sub-ADC, wherein the initial amplitude value comprises a highest value; and
successively decrementing in a loop the initial amplitude value and possible subsequent amplitude values of the calibration signal to reach the amplitude for the calibration signal, for which the output signal of the reference sub-ADC is no longer clipped.

15. The apparatus of clause 11 or any other clauses, further comprising a mission-mode telemetry module configured to provide mission-mode telemetry data, wherein:
mission-mode telemetry data is associated with each sub-ADC and comprises serial data resulting from accumulation of calibration output data of that sub-ADC over a predetermined period of time during a normal operation of the ADC,
the mission-mode telemetry data enables remote adjustment of one or more software-controlled calibration parameters of that sub-ADC during a mission mode calibration.

16. The apparatus of clause 15 or any other clauses, wherein the mission-mode telemetry module comprises:
an absolute-value block configured to receiving, during the normal operation of the ADC, gain data from the sub-ADC including and to generate an absolute value of the gain data;
a first integration block configured to integrate the absolute values the gain data over the predetermined period of time during the normal operation of the ADC;
a first register configured to store the integrated absolute values of the gain data;
a second integration block configured to integrate offset data received from the sub-ADC over the predetermined period of time during the normal operation of the ADC; and
a second register configured to store the integrated offset data.

17. The apparatus of clause 11 or any other clauses, further comprising an offset-correction path configured to generate, for each sub-ADC, other than the reference ADC, a corresponding offset-error signal based on the corresponding error signal,
wherein:
the offset-correction path comprises a first accumulator and is configured to generate the corresponding offset-error signal by using a first software-controlled parameter and the first accumulator, the offset-correction path is configured to calibrate each sub-ADC, other than the reference ADC, based on the corresponding error signal by adjusting an offset of each sub-ADC, other than the reference ADC, at an output node of that sub-ADC in digital domain, and the offset-correction path is configured to adjust the offset of each sub-ADC, other than the reference ADC, at the output node of that sub-ADC by generating a new value for the output signal of the sub-ADC by combining the corresponding offset-error signal with a previous value of the output signal of the sub-ADC.

further comprising an offset error monitor configured to automatically detect a convergence of the offset-correction path, by:

allowing the offset-calibration loop to run for N-WAIT cycles before starting to check if the offset-calibration loop has converged, wherein N-WAIT is programmable, wherein N-WAIT comprises an integer greater than zero;

determining that the convergence of the offset-calibration loop is reached when an absolute offset-correction and a cycle-to-cycle change in offset-correction are within predetermined tolerances; and when the convergence of the offset-calibration loop is not reached, allowing the offset-calibration loop to run for up to a maximum N-MAX-ITER more cycles until the convergence of the offset-calibration loop is reached or non-convergence is detected as a BIST failure, wherein N-MAX-ITER is programmable, wherein N-MAX-ITER comprises an integer greater than zero.

18. The apparatus of clause 11 or any other clauses, wherein:

the gain-correction path is configured to calibrate each sub-ADC based on the corresponding error signal by adjusting a corresponding reference voltage of each sub-ADC, the gain-correction path is configured to adjust the corresponding reference voltage of each sub-ADC by modifying an input digital code to a corresponding gain-adjustment digital-to-analog converter (DAC) that generates the reference voltage of each sub-ADC, the gain-correction path is configured to modify the input digital code to the corresponding gain-adjustment DAC based on the corresponding gain-error signal, the gain-correction path is configured to generate the corresponding gain-error signal by using a product of three terms, and the apparatus further comprises:
gain-correction registers configured to store a corresponding gain-correction including the modified input digital code to gain-adjustment DACs for later retrieval, and
a gain error monitor configured to automatically detect a convergence of the gain-correction path.

19. The apparatus of clause 11 or any other clauses, wherein the calibration-signal generator is configured to generate the calibration signal that comprises:
distinct values,
a square wave with added white Gaussian Noise, and
an adjustable amplitude.

20. The apparatus of clause 11 or any other clauses, further comprising a startup calibration module and a mission mode calibration module, wherein:

the startup calibration module is configured to perform a startup calibration after an initialization of a chip or following a cold start of the chip, the mission calibration module is configured to perform the mission calibration after the startup calibration and during normal operation of the chip, subsequent to a warm start following an idle state, or in response to an external return command, the startup calibration and the mission calibration are bypass-able by external commands, and the idle state is reached after a freeze resulting from an external freeze command or a loss of signal.

21. A hardware apparatus comprising circuits configured to perform one or more methods or operations of any one of clauses 1-20 (e.g., 100 of FIG. 1 and 400B of FIG. 4B) or any other clauses.

22. An apparatus comprising means (e.g., modules of Apparatus of FIG. 7) adapted for performing one or more methods or operations of any one of clauses 1-20 or any other clauses.

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals or differential current signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. A method for calibration of an analog-to-digital converter (ADC) including a plurality of sub-ADCs, comprising:
   selecting a reference sub-ADC from the plurality of sub-ADCs based on a non-zero input signal applied to each sub-ADC, a corresponding output signal from each sub-ADC, and a stored value;
   applying a calibration signal to an input node of each sub-ADC of the plurality of sub-ADCs, other than the reference ADC;
   for each sub-ADC of the plurality of sub-ADCs, other than the reference ADC, generating a corresponding error signal based on output signals of the sub-ADC and a reference sub-ADC; and
   calibrating each sub-ADC of the plurality of ADCs, other than the reference ADC, based on the corresponding error signal.

2. The method of claim 1, wherein selecting the reference ADC from the plurality of sub-ADCs comprises:
   applying the non-zero input voltage signal to the input node of each sub-ADC;
   generating a deviation error based on a subtraction of a stored value from the measured output signal of each sub-ADC; and
   designating as the reference sub-ADC a sub-ADC from the plurality of the sub-ADCs based on the deviation error, and wherein:
   the stored value comprises an expected value for the output signal of a desired sub-ADC in response to the non-zero input voltage signal,
   the deviation error comprises an average of N subtraction results corresponding to N measured output signals of each sub-ADC, and
   N comprises a positive integer.

3. The method of claim 2, wherein generating the corresponding error signal based on the output signals of that sub-ADC and the reference sub-ADC comprises using a calibration loop that acts to reduce a mean-square difference between the output signals of that sub-ADC and the reference sub-ADC.

4. The method of claim 1, further comprising adjusting an amplitude of the calibration signal prior to applying the calibration signal, wherein adjusting the amplitude of the calibration signal comprises:
   (a) setting the amplitude of the calibration signal to a maximum value;
   (b) applying the calibration signal to an input node of the reference sub-ADCs and measuring a corresponding output signal;
   (c) determining whether the corresponding output signal is clipped;
   (d) in response to the determination that the corresponding output signal is clipped, decrementing the amplitude of the calibration signal by one least significant bit (LSB) and continuing with step (b); and
   (e) in response to the determination that the corresponding output signal is not clipped, decrementing the amplitude of the calibration signal by one least significant bit (LSB).

5. The method of claim 1, further comprising providing mission-mode telemetry data, wherein:
   mission-mode telemetry data is associated with each sub-ADC and comprises serial data resulting from accumulation of calibration output data of that sub-ADC over a predetermined period of time during a normal operation of the ADC,
   the mission-mode telemetry data enables remote adjustment of one or more software-controlled calibration parameters of that sub-ADC during a mission mode calibration.

6. The method of claim 5, wherein providing mission-mode telemetry data comprises:
   receiving, during the normal operation of the ADC, calibration output data from the sub-ADC, the calibration output data comprising offset data and gain data;
   generating an absolute value of the gain data and integrating the absolute values the gain data over the predetermined period of time during an normal operation of the ADC;
   copying the integrated absolute values of the gain data into a first register;
   integrating the offset data over the predetermined period of time during an normal operation of the ADC; and
   copying the integrated offset data into a second register.

7. The method of claim 1, further comprising generating for each sub-ADC a corresponding offset-error signal based on the corresponding error signal,
   wherein:
   generating the corresponding offset-error signal comprises using a first software-controlled parameter and a first accumulator in an offset-calibration loop,
   the offset-calibration loop comprises calibrating each sub-ADC based on the corresponding error signal by adjusting an offset of each sub-ADC at an output node of that sub-ADC in digital domain, and
   adjusting the offset of each sub-ADC at the output node of that sub-ADC comprises generating a new value for the output signal of the sub-ADC by combining the corresponding offset-error signal with a previous value of the output signal of the sub-ADC.

8. The method of claim 1, further comprising generating for each sub-ADC a corresponding gain-error signal based on the corresponding error signal in a gain-calibration loop,
   wherein:
   the gain-calibration loop comprises calibrating each sub-ADC based on the corresponding error signal by adjusting a corresponding reference voltage of each sub-ADC,
   adjusting the corresponding reference voltage of each sub-ADC comprises modifying an input digital code to a corresponding gain-adjustment digital-to-analog converter (DAC) that generates the corresponding reference voltage of each sub-ADC, modifying the input digital code to the corresponding gain-adjustment DAC is based on the corresponding gain-error signal, and generating the corresponding gain-error signal comprises taking a product of three terms comprising the corresponding error signal, a sign of the output signal of the reference sub-ADC, a software-controlled parameter, and accumulating the product in a second accumulator, storing a corresponding gain-correction including the modified input digital code in gain-adjustment DACs for later retrieval, automatically detecting a convergence of the gain-calibration loop.

9. The method of claim 1, wherein:
the calibration of the ADC comprises a startup calibration and a background calibration,
the startup calibration is performed after an initialization of a chip or following a cold start of the chip,
the background calibration is performed after the startup calibration and during normal operation of the chip, subsequent to a warm start following an idle state, or in response to an external return command,
the startup calibration and the background calibration are bypass-able by external commands, and
the idle state is reached after a freeze resulting from an external freeze command or a loss of signal.

10. An apparatus for calibration of an analog-to-digital converter (ADC) including a plurality of sub-ADCs, comprising:
a reference sub-ADC, configured to be selected from the plurality of sub-ADCs;
a calibration-signal generator configured to provide a calibration signal at an input node of each sub-ADC of the plurality of sub-ADCs; and
a gain-correction path configured to generate, for each sub-ADC of the plurality of sub-ADCs, other than the reference sub-ADC, a corresponding error signal based on output signals of the sub-ADC and the reference sub-ADC, wherein
each sub-ADC, other than the reference ADC, is configured to be calibrated based on the corresponding error signal, and
the apparatus is configured to provide selection of the reference sub-ADC from the plurality of sub-ADCs based on a non-zero input signal applied to each sub-ADC, a corresponding output signal of each sub-ADC, and a stored value.

11. The apparatus of claim 10, the apparatus is configured to provide selection of the reference sub-ADC from the plurality of sub-ADCs based on:
applying the non-zero input voltage signal to the input node of each sub-ADC;
measuring the corresponding output signal of each sub-ADC in response to the non-zero input voltage signal;
generating a deviation error based on a subtraction of a stored value from the measured output signal of each sub-ADC; and
designating as the reference sub-ADC a sub-ADC from the plurality of the sub-ADC based on the deviation error, wherein:
the apparatus further comprises:
one of a register or a look-up table configured to store an expected value for the output signal of a desired sub-ADC in response to the non-zero input voltage signal,
a subtraction block configured to subtract the stored expected value for the output signal of the desired sub-ADC from the measured output signal of each sub-ADC to generate a subtraction result;
an absolute module block configured to generate an absolute value of the subtraction result;
the processor configured to generate an average of N subtraction results corresponding to N measured output signals of each sub-ADC, wherein N comprises a positive integer.

12. The apparatus of claim 10, wherein the gain-correction path is configured to act to reduce a mean-square difference between the output signals of that sub-ADC and the reference sub-ADC.

13. The apparatus of claim 10, wherein the gain-correction path is configured to determine an amplitude for the calibration signal by:
applying the calibration signal with an initial amplitude value to the reference sub-ADC, wherein the initial amplitude value comprises a highest value; and
successively decrementing in a loop the initial amplitude value and possible subsequent amplitude values of the calibration signal to reach the amplitude for the calibration signal, for which the output signal of the reference sub-ADC is no longer clipped.

14. The apparatus of claim 10, further comprising a mission-mode telemetry module configured to provide mission-mode telemetry data, wherein:
mission-mode telemetry data is associated with each sub-ADC and comprises serial data resulting from accumulation of calibration output data of that sub-ADC over a predetermined period of time during a normal operation of the ADC,
the mission-mode telemetry data enables remote adjustment of one or more software-controlled calibration parameters of that sub-ADC during a mission mode calibration.

15. The apparatus of claim 14, wherein the mission-mode telemetry module comprises:
an absolute-value block configured to receiving, during the normal operation of the ADC, gain data from the sub-ADC including and to generate an absolute value of the gain data;
a first integration block configured to integrate the absolute values the gain data over the predetermined period of time during the normal operation of the ADC;
a first register configured to store the integrated absolute values of the gain data;
a second integration block configured to integrate offset data received from the sub-ADC over the predetermined period of time during the normal operation of the ADC; and
a second register configured to store the integrated offset data.

16. The apparatus of claim 10, further comprising an offset-correction path configured to generate, for each sub-ADC, other than the reference ADC, a corresponding offset-error signal based on the corresponding error signal, wherein:
the offset-correction path comprises a first accumulator and is configured to generate the corresponding offset-error signal by using a first software-controlled parameter and the first accumulator,
the offset-correction path is configured to calibrate each sub-ADC, other than the reference ADC, based on the corresponding error signal by adjusting an offset of each sub-ADC, other than the reference ADC, at an output node of that sub-ADC in digital domain, and the offset-correction path is configured to adjust the offset of each sub-ADC, other than the reference ADC, at the output node of that sub-ADC by generating a new value for the output signal of the sub-ADC by combining the corresponding offset-error signal with a previous value of the output signal of the sub-ADC;

further comprising an offset error monitor configured to automatically detect a convergence of the offset-correction path, by:

allowing the offset-calibration loop to run for N-WAIT cycles before starting to check if the offset-calibration loop has converged, wherein N-WAIT is programmable, wherein N-WAIT comprises an integer greater than zero;

determining that the convergence of the offset-calibration loop is reached when an absolute offset-correction and a cycle-to-cycle change in offset-correction are within predetermined tolerances; and when the convergence of the offset-calibration loop is not reached, allowing the offset-calibration loop to run for up to a maximum N-MAX-ITER more cycles until the convergence of the offset-calibration loop is reached or non-convergence is detected as a BIST failure, wherein N-MAX-ITER is programmable, wherein N-MAX-ITER comprises an integer greater than zero.

17. The apparatus of claim 10, wherein:

the gain-correction path is configured to calibrate each sub-ADC based on the corresponding error signal by adjusting a corresponding reference voltage of each sub-ADC, the gain-correction path is configured to adjust the corresponding reference voltage of each sub-ADC by modifying an input digital code to a corresponding gain-adjustment digital-to-analog converter (DAC) that generates the reference voltage of each sub-ADC, the gain-correction path is configured to modify the input digital code to the corresponding gain-adjustment DAC based on the corresponding gain-error signal, the gain-correction path is configured to generate the corresponding gain-error signal by using a product of three terms, and the apparatus further comprises:

gain-correction registers configured to store a corresponding gain-correction including the modified input digital code to gain-adjustment DACs for later retrieval, and a gain error monitor configured to automatically detect a convergence of the gain-correction path.

18. The apparatus of claim 10, wherein the calibration-signal generator is configured to generate the calibration signal that comprises:

distinct values, a square wave with added white Gaussian Noise, and an adjustable amplitude.

19. The apparatus of claim 10, further comprising a startup calibration module and a mission mode calibration module, wherein:

the startup calibration module is configured to perform a startup calibration after an initialization of a chip or following a cold start of the chip, the mission calibration module is configured to perform the mission calibration after the startup calibration and during normal operation of the chip, subsequent to a warm start following an idle state, or in response to an external return command, the startup calibration and the mission calibration are bypass-able by external commands, and the idle state is reached after a freeze resulting from an external freeze command or a loss of signal.

* * * * *